United States Patent
Cui et al.

(10) Patent No.: US 9,537,387 B2
(45) Date of Patent: Jan. 3, 2017

(54) REFERENCE SIGNAL GENERATING CIRCUIT AND METHOD USING A SAMPLED INPUT SIGNAL AND A REFERENCE CLOCK SIGNAL, AND POWER FACTOR COMPENSATION APPARATUS HAVING THE SAME

(71) Applicant: MagnaChip Semiconductor, Ltd., Cheongju-si (KR)

(72) Inventors: Zhi Yuan Cui, Cheongju-si (KR); Younggi Ryu, Seoul (KR); Inho Hwang, Incheon (KR); Sang Hoon Jung, Seoul (KR); Taeyoung Park, Anyang-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 197 days.

(21) Appl. No.: 14/338,765

(22) Filed: Jul. 23, 2014

(65) Prior Publication Data

US 2015/0061609 A1    Mar. 5, 2015

(30) Foreign Application Priority Data

Aug. 30, 2013   (KR) .................. 10-2013-0104403

(51) Int. Cl.
*H02M 1/42*   (2007.01)
*G01R 25/00*   (2006.01)
*H02M 1/00*   (2006.01)

(52) U.S. Cl.
CPC .............. *H02M 1/4225* (2013.01); *H02M 1/42* (2013.01); *H02M 1/4208* (2013.01); *G01R 25/005* (2013.01); *H02M 2001/0012* (2013.01); *H02M 2001/0025* (2013.01); *Y02B 70/126* (2013.01)

(58) Field of Classification Search
CPC .... H02M 1/42; H02M 1/4208; H02M 1/4225; H02M 2001/0012; H02M 2001/0025; H02M 3/157
See application file for complete search history.

(56) References Cited

U.S. PATENT DOCUMENTS

| 4,755,774 A * | 7/1988 | Heck ................... | H03C 3/0941 332/123 |
| 7,045,993 B1 * | 5/2006 | Tomiyoshi .......... | H02M 3/1588 323/224 |
| 7,480,159 B2 * | 1/2009 | Wei ...................... | H02M 3/335 363/21.1 |
| 8,125,197 B2 | 2/2012 | Hwang et al. | |

(Continued)

FOREIGN PATENT DOCUMENTS

KR    10-2010-0011836 A    2/2010

*Primary Examiner* — Timothy J Dole
*Assistant Examiner* — Ishrat Jamali (57) ABSTRACT

A reference signal generating circuit is provided that generates a reference signal corresponding to an input signal for power factor compensation of a power converter. The reference signal generating circuit includes a detector sampling the input signal according to a reference clock to detect and hold the maximum input signal and a phase measuring unit measuring a phase of the sampled input signal based on the sampled input signal and the detected maximum input signal. The circuit also includes a reference signal generating unit configured to generate a reference signal having a specific value in response to the measured phase.

23 Claims, 9 Drawing Sheets

(56) References Cited

U.S. PATENT DOCUMENTS

| | | |
|---|---|---|
| 8,148,956 B2 | 4/2012 | Hwang et al. |
| 2006/0061337 A1* | 3/2006 | Kim .................. G05F 1/70 323/205 |
| 2008/0205103 A1* | 8/2008 | Sutardja .............. G05F 1/70 363/84 |
| 2010/0109615 A1 | 5/2010 | Hwang et al. |
| 2010/0128501 A1* | 5/2010 | Huang ............ H02M 3/33523 363/21.16 |
| 2014/0036559 A1* | 2/2014 | Watanabe ............ G01R 19/00 363/84 |

* cited by examiner

REFERENCE SIGNAL GENERATING CIRCUIT AND METHOD USING A SAMPLED INPUT SIGNAL AND A REFERENCE CLOCK SIGNAL, AND POWER FACTOR COMPENSATION APPARATUS HAVING THE SAME

CROSS-REFERENCE TO RELATED APPLICATIONS

This application claims the benefit under 35 USC 119(a) of Korean Patent Application No. 10-2013-0104403 filed on Aug. 30, 2013, in the Korean Intellectual Property Office, the entire disclosure of which is incorporated herein by reference for all purposes.

BACKGROUND

1. Field

The following description relates to a reference signal generation and a power factor compensation technique. The following description also relates to a reference signal generating circuit and a power factor compensation apparatus that measures a phase for an input signal of a power converter, in order to generate a reference signal having a specific amplitude and in order to improve power factor correction.

2. Description of Related Art

A power converter converts inputted power into another, outputted power, such as an outputted power having a different current, voltage or frequency. For example, the power converter receives inputted power to provide outputted power to a load, for example, a LED lamp. Herein, the inputted power may correspond to an alternating current AC power and the outputted power may correspond to a direct current DC power.

A waveform of a current flowing into the load is similar to that of a current of the inputted power. However, a reactive power loss may occur due to a phase difference between a voltage and a current of the inputted power.

In order to decrease the reactive power loss and to improve a power factor correction of the power converter, the phase difference between a voltage and a current of the inputted power may be decreased.

Some power converters perform a full-wave rectification on an inputted alternating current power source to generate an input voltage and sense the input voltage to generate a reference signal. Such power converters compare the reference signal and the current flowing into the load to control a level of the current flowing into the load based on the reference signal. The reference signal is varied according to the input voltage. Accordingly, a level of the current flowing into the load is varied according to the reference signal. Therefore, a frequency and a phase for the current flowing into the load are similar to those of the input voltage. For example, when the input voltage corresponds to a sine wave, the input current waveform becomes similar to a sine wave. As a result, the phase difference between a voltage and a current of the inputted power may be decreased, as discussed above.

However, when such power converters use a resistor element in order to detect the input current, it may be difficult to integrate a control unit for controlling the power converter into the architecture of the power converter due to difficulties of integrating resistors that resist a high input voltage.

Figure 1:
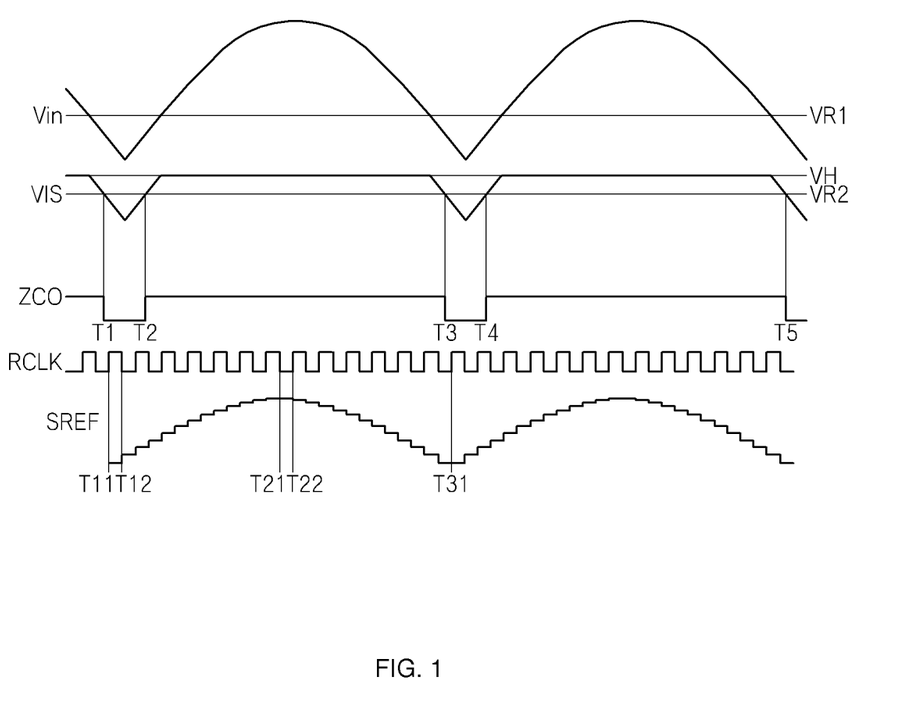
FIG. 1 is a waveform diagram illustrating a reference signal being generated by a power factor correction circuit.

FIG. 1 is a waveform diagram illustrating a reference signal that is generated by a power converter. Referring to FIG. 1, the power factor correction circuit approximately measures a single period, such as T1 through T3, to generate a corresponding reference clock RCLK signal. Therefore, the power factor correction circuit generates a sine wave SREF programmed in a digital/analog converter (D/A converter), based on the generated reference clock RCLK.

In the power factor correction circuit, an error of the reference clock RCLK may occur due to an error of single period information, such as T1 through T3. However, a correction for the error in the D/A converter is not performed and a distortion between the input voltage Vin and the sine wave SREF occurs according as the sine wave SREF programmed regardless of how the input signal Vin is generated.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a reference signal generating circuit for generating a reference signal based on an input signal for power factor compensation of a power converter, the reference signal generating circuit includes a detector configured to sample the input signal according to a reference clock signal and to detect a maximum input signal to hold, a phase measuring unit configured to measure a phase of the sampled input signal based on the sampled input signal and the detected maximum input signal, and a reference signal generating unit configured to generate a reference signal having a specific value in response to the measured phase.

The detector may include a sampling unit configured to repeatedly sample the input signal and hold the sampled input signal based on the reference clock signal, and a peak detector configured to detect and hold the maximum input signal.

The phase measuring unit may include a selection switch configured to alternately couple the sampling unit and an output terminal of the detector to an input terminal of the phase measuring unit based on the reference clock signal.

The phase measuring unit may include a calculation unit configured to alternately receive and integrate the sampled input signal according to the reference clock signal and the detected maximum input signal to generate an intermediate calculation signal, and a calculation control unit configured to convert the intermediate calculation signal into a time domain to measure the phase of the sampled input signal.

The calculation unit may perform a positive integration calculation on the sampled input signal and may perform a negative integration calculation on the detected maximum input signal.

The calculation control unit may generate a pulse signal based on an interval where a level of the intermediate calculation signal is larger than a reference value while the calculation unit performs the integral calculation on the detected maximum input signal.

The reference signal generating unit may include a current source configured to provide a current having a specific value, a capacitor configured to charge using the current having the specific value to generate a reference voltage, and a switch configured to couple the current source and the capacitor based on the measured phase.

The reference signal generating unit may be configured to sample and to hold the generated reference voltage based on the reference clock signal to output the reference signal.

The phase measuring unit may include a division calculation unit configured to measure a phase of the sampled input signal by performing a division calculation.

In another general aspect, a power factor compensation apparatus for compensating a power factor of a power converter includes a power transfer device into which an input current corresponding to an input signal flows, an output switch that is coupled to the power transfer device, the output switch being configured to adjust an output voltage that is generated by the input current of the power transfer device, an output capacitor configured to charge using the input current to generate a output voltage, a reference signal generating circuit configured to generate a reference signal based on the input signal, and a power factor compensation control unit configured to compare the output voltage and the reference signal to control the output switch, wherein the reference signal generating circuit includes a detector configured to sample the input signal according to a reference clock signal and to detect a maximum input signal to hold, a phase measuring unit configured to measure a phase of the sampled input signal based on the sampled input signal and the detected maximum input signal, and a reference signal generating unit configured to generate a reference signal having a specific value in response to the measured phase.

In another general aspect, a reference signal generating method for generating a reference signal corresponding to an input signal for a power factor compensation of a power converter includes sampling the input signal based on a reference clock and detecting a maximum input signal to hold, measuring a phase of the sampled input signal based on the sampled input signal and the detected maximum input signal, and generating a reference signal having a specific value in response to the measured phase.

The measuring may include alternately selecting the sampled input signal based on the reference clock signal and the detected maximum input signal.

The measuring may further include alternately receiving and integrating the sampled input signal according to the reference clock signal and the detected maximum input signal to generate an intermediate calculation signal, and converting the intermediate calculation signal into a time domain to measure the phase of the sampled input signal.

The alternatively receiving and integrating may include performing a positive integration calculation on the sampled input signal and performing a negative integration calculation on the detected maximum input signal.

The converting may generate a pulse signal based on an interval where a level of the intermediate calculation signal is larger than a reference value while the integration calculation for the detected maximum input signal is performed.

The generating the reference signal may charge a capacitor using a current having a specific value based on the measured phase to generate a reference voltage.

The generating the reference signal may further include sampling and holding the generated reference voltage based on the reference clock signal to output the reference signal.

The measuring may measure a phase of the sampled input signal by performing a division calculation.

In another general aspect, a circuit for measuring phase information includes a detector configured to sample the input signal according to a reference clock signal and to detect a maximum input signal to hold, and a phase measuring unit configured to measure a phase of the sampled input signal based on the sampled input signal and the detected maximum input signal.

The detector may include a sampling unit configured to repeatedly sample the input signal and hold the sampled input signal based on the reference clock signal, and a peak detector configured to detect and hold the maximum input signal.

The phase measuring unit may include a calculation unit configured to alternately receive and integrate the sampled input signal according to the reference clock signal and the detected maximum input signal to generate an intermediate calculation signal, and a calculation control unit configured to convert the intermediate calculation signal into a time domain to measure the phase of the sampled input signal.

The present examples propose a reference signal generating technique for accurately applying phase and frequency information of an input signal.

Additionally, the present examples propose a power factor compensation technique for performing a power factor correction of a power converter without an additional control circuit.

The examples relate to a reference signal generating circuit and method and power factor compensation apparatus having the same measure as a phase of an input signal to generate a reference signal accurately applying phase and frequency information of the input signal.

The examples relate to a reference signal generating circuit and method and a power factor compensation apparatus having the same that performs a power factor correction of a power converter without an additional control circuit.

Other features and aspects will be apparent from the following detailed description, the drawings, and the claims.

BRIEF DESCRIPTION OF THE DRAWINGS

FIG. 2 is block diagram illustrating the reference signal generating circuit of

FIG. 2.

FIG. 3 is a circuit diagram illustrating the reference signal generating circuit of

FIG. 2.

FIG. 5 is a waveform diagram illustrating a calculation of the calculation unit of

FIG. 3.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Terms used in the present disclosure are to be understood as follows.

While terms such as "first" and "second," etc., are used to describe various components, such components are not intended to be understood as being limited to the above terms. The above terms are used only to distinguish one component from another. For example, it is possible that a first component is referred to as a second component without departing from the scope of rights of the present invention, and likewise it is possible that a second component is referred to as a first component.

It is meant to be understood that when an element is referred to as being "connected to" another element, it can be directly connected to the other element or intervening elements may also be present. In contrast, when an element is referred to as being "directly connected to" another element, no intervening elements are present. In addition, unless explicitly described to the contrary, the word "comprise" and variations such as "comprises" or "comprising," is to be understood to imply the inclusion of stated elements but not the exclusion of any other elements. Meanwhile, other expressions describing relationships between components such as "~ between", "immediately ~ between" or "adjacent to ~" and "directly adjacent to ~" are to be construed similarly to the other terms just discussed.

Singular articles "a", "an" and "the" in the present disclosure are intended and used to include the plural forms as well, unless the context clearly indicates otherwise. It is also to be further understood that terms such as "including" or "having," etc., are intended to indicate the existence of the features, numbers, calculations, actions, components, parts, or combinations thereof as disclosed in the specification, and are not intended to preclude the possibility that one or more other features, numbers, calculations, actions, components, parts, or combinations thereof optionally exist or are optionally added.

The terms used in the present application are merely used to describe particular examples, and are not intended to limit the present invention. Unless otherwise defined, all terms used herein, including technical or scientific terms, have the same customary meanings as those generally understood by those with ordinary knowledge in the field of art to which the present invention belongs. Such terms as those defined in a generally used dictionary are to be interpreted to have the meanings equal to the contextual meanings in the relevant field of art, and are not to be interpreted to have ideal or excessively formal meanings unless clearly defined in the present application.

Figure 2:
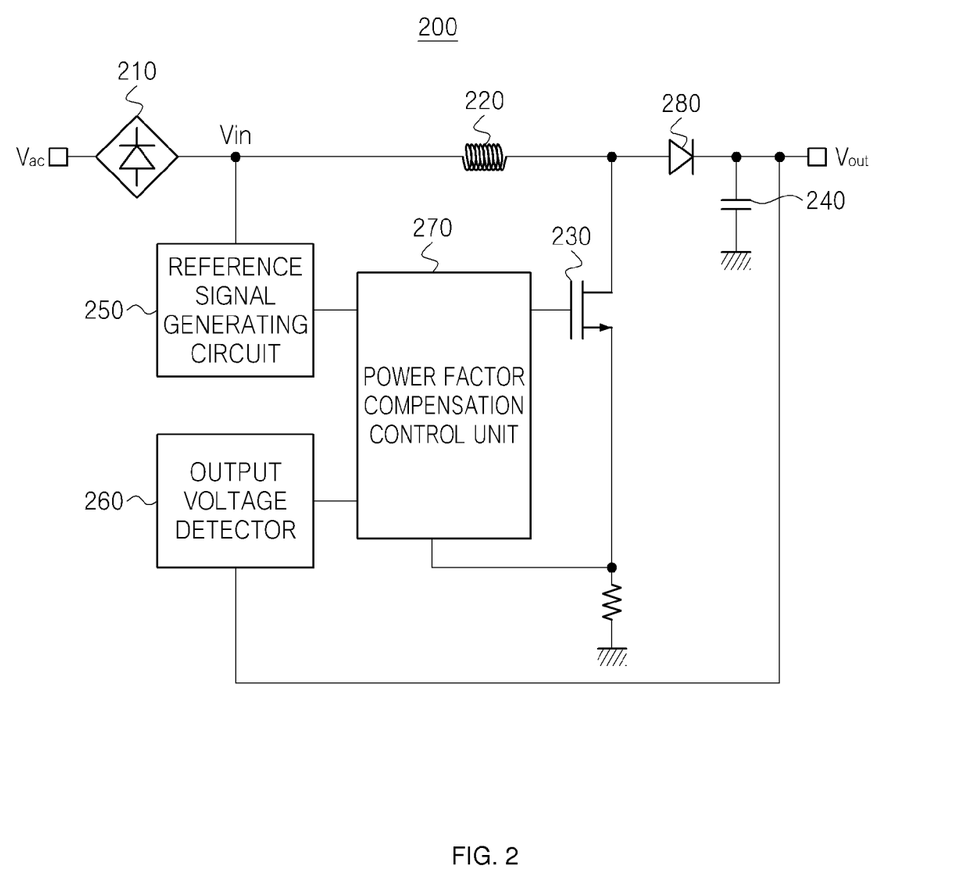

FIG. 2 is block diagram illustrating a power factor compensation apparatus according to an example.

Referring to the example of FIG. 2, a power factor compensation circuit 200 includes a rectification unit 210, a power transfer device 220, an output switch 230, an output capacitor 240 generating an output voltage, a reference signal generating circuit 250, an output voltage detector 260 and a power factor compensation control unit 270.

In the example of FIG. 2, the rectification unit 210 performs a full-wave rectification on alternating current power that is provided to a power converter in order to generate an input signal Vin. In an example, the rectification unit 210 is implemented by a diode bridge. A diode bridge is an arrangement of four or more diodes in a bridge circuit configuration that provides the same polarity of output for either polarity of input.

Additionally, the power transfer device 220 transfers an input current corresponding to the input signal Vin to a load. In an example, the power transfer device 220 is implemented by an inductor.

The output switch 230 is coupled to a rear part of the power transfer device 220 to adjust an output voltage Vout that is generated from the input current received by the power transfer device 220. The output switch 230 is operated by a control signal received from the power factor compensation control unit 270. In an example, the output switch 230 is implemented by a Metal Oxide Semiconductor Field Effect Transistor (MOSFET). The power factor compensation control unit 270 is described further, below.

When the output switch 230 is turned on, the input current flows into the output switch 230. Alternatively, when the output switch 230 is turned off, the input current flows into an output terminal coupled to the load.

In an example, a diode 280 is coupled between the output switch 230 and the output terminal in series. Thus, an anode of the diode 280 is coupled to the power transfer device 220 and a cathode of the diode 280 is coupled to the output terminal to control current flow according to operation of the output switch 230.

The output capacitor 240 is also coupled to a rear part of the power transfer device 220. The output capacitor 240 charges using the input current to generate the output voltage Vout.

The reference signal generating circuit 250 detects the input signal Vin at the front part of the power transfer device 220 to sample and to detect a maximum input signal Vpeak based on characteristics of the input signal Vin. The reference signal generating circuit 250 measures a phase of the sampled input signal based on the sampled input signal Vsh and the detected maximum input signal Vpeak. Additionally, the reference signal generating circuit 250 generates a reference signal Vref having a specific amplitude in response to the measured phase.

The output voltage detector 260 detects the output voltage Vout of the output terminal. Based on detecting the output voltage, the output voltage detector 260 provides the detected output voltage to the power factor compensation control unit 270.

The power factor compensation control unit 270 compares the output voltage Vout and the reference signal Vref.

Based on the comparison, the power factor compensation control unit 270 senses a current of the output switch 230 to control the output switch 230.

The power factor compensation control unit 270 also amplifies a difference between the output voltage Vout and the reference signal Vref to generate an error signal. In an example, the power factor compensation control unit 270 controls the output switch 230 based on the generated error signal.

Figure 3:
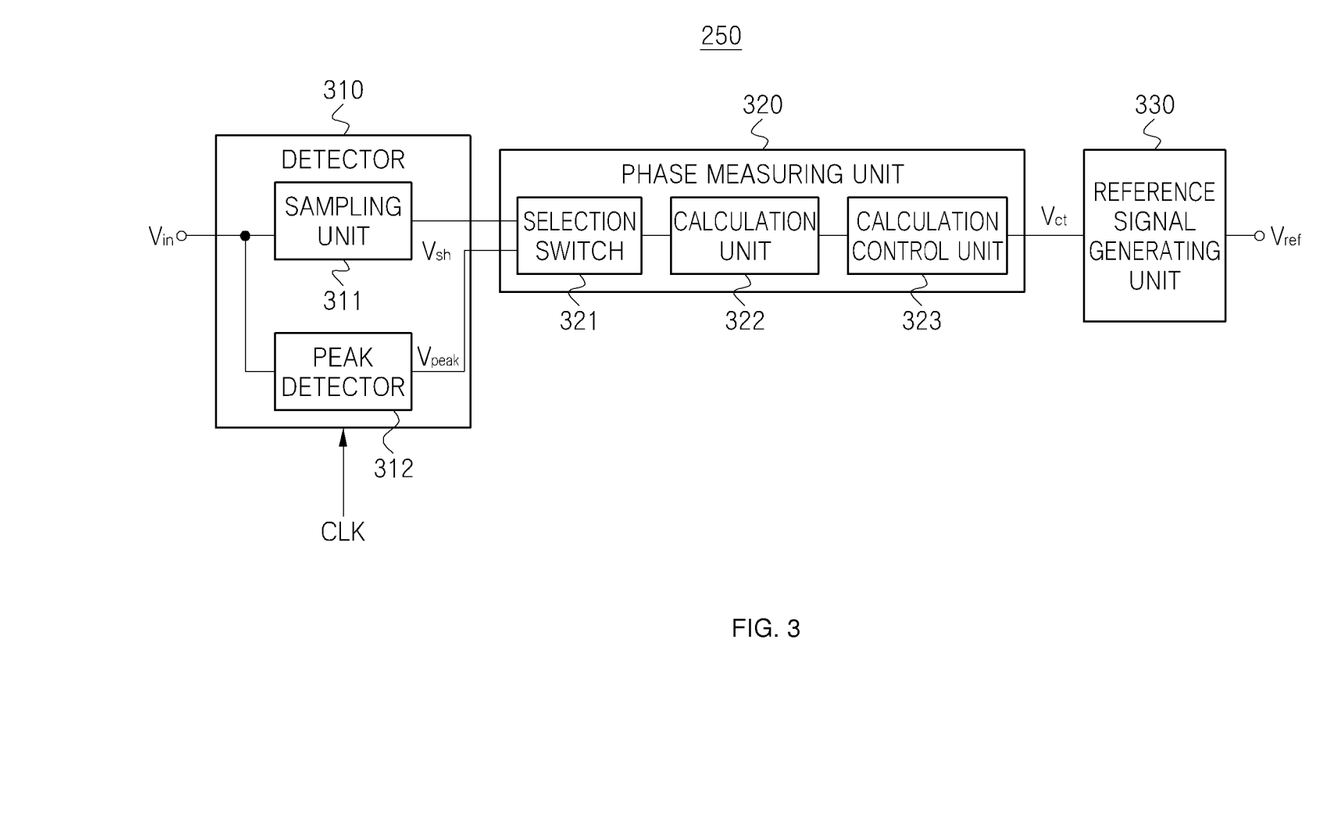
Figure 4:
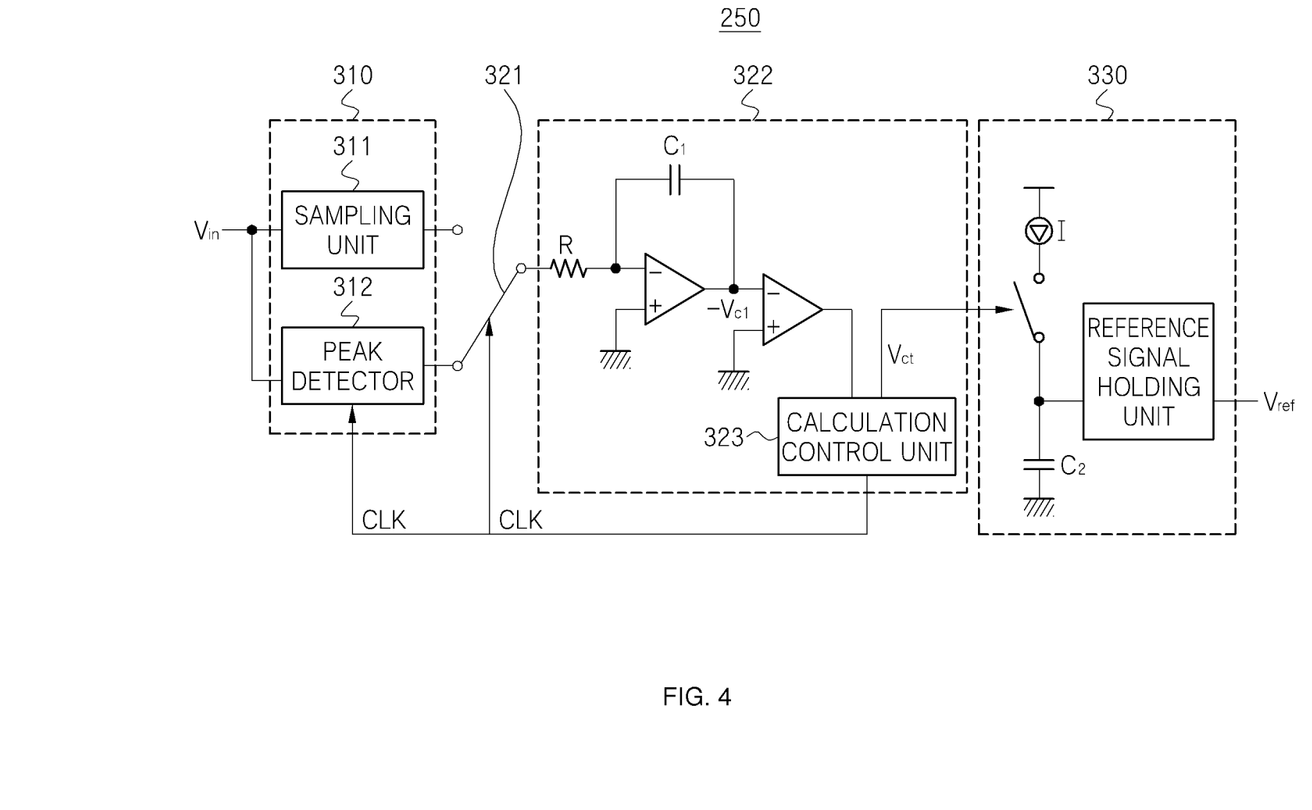
FIG. 4 is a circuit diagram illustrating the power factor compensation apparatus of FIG. 2.

FIG. 3 is a block diagram illustrating the reference signal generating circuit of FIG. 2 and FIG. 4 is a circuit diagram illustrating the reference signal generating circuit of FIG. 2.

Referring to FIGS. 3 through 4, the reference signal generating circuit 250 includes a detector 310, a phase measuring unit 320 and a reference signal generating unit 330.

The detector 310 samples the input signal Vin according to a reference clock signal CLK to detect and maintain the maximum input signal Vpeak.

In an example, the detector 310 includes a sensing unit that senses the input signal Vin.

In one example, the detector 310 includes a sampling unit 311 and a peak detector 312. The sampling unit 311 repeatedly samples the input signal Vin based on the reference clock signal CLK and holds the sampled input signal Vsh when the peak detector 312 detects an maximum input signal Vpeak to hold. Herein, the reference clock signal CLK potentially corresponds to a square wave having a specific period. In an example of such a square wave, a phase of the reference clock signal CLK includes a high value such as 1 and a low value such as 0.

When a phase of the reference clock signal CLK is high, the sampling unit 311 samples the input signal Vin and when a phase of the reference clock signal CLK is low, the sampling unit 311 holds the sampled input signal Vsh.

The peak detector 312 detects the maximum input signal Vpeak per the period of the input signal Vin. Additionally, the peak detector 312 holds the maximum input signal Vpeak during a period of a next input signal. In an example, the maximum input signal Vpeak is used to measure the phase of the sampled input signal Vsh.

The phase measuring unit 320 measures the phase of the sampled input signal Vsh based on the sampled input signal Vsh and the detected maximum input signal Vpeak.

In one example, the phase measuring unit 320 includes a selection switch unit 321. The selection switch unit 321 alternately couples each of output terminals of the sampling unit 311 and the peak detector 312 based on the reference clock signal CLK to an input terminal of the phase measuring unit 320.

For example, when the phase of the reference clock signal CLK corresponds to a high state, the selection switch unit 321 selects the maximum input signal Vpeak provided by the peak detector 312 and when the phase of the reference clock signal CLK corresponds to a low state, the selection switch unit 321 selects the sampled input signal Vsh provided by the sampling unit 311.

In examples, the phase measuring unit 320 measures the phase of the sampled input signal (Vsh) through an integral calculation or division calculation. However, these are merely examples and other techniques are used to measure the phase of the sampled input in other examples.

In one example, the phase measuring unit 320 includes a calculation unit 322 and a calculation control unit 323. In such an example, the calculation unit 322 alternately receives and integrates the sampled input signal Vsh and the detected maximum input signal Vpeak according to the reference clock signal CLK to generate an intermediate calculation signal. The calculation control unit 323 converts the intermediate calculation signal into a time domain based on the detected maximum input signal Vpeak to measure the phase of the sampled input signal Vsh.

Referring to the example of FIG. 4, the calculation unit 322 is implemented as a resistor R that is coupled with the selection switch and a negative input terminal of an amplifier and a capacitor C1 that is coupled with the negative input terminal and an output terminal of the amplifier.

In one example, the calculation unit 322 performs a positive integration calculation on the sampled input signal Vsh and performs a negative integration calculation on the detected maximum input signal Vpeak. An integration calculation procedure is described further, below.

In one example, the calculation unit 322 further includes a second amplifier that amplifies the intermediate calculation signal.

The calculation control unit 323 converts the intermediate calculation signal into the time domain.

In one example, while the calculation unit 322 operates on the detected maximum input signal Vpeak, the calculation control unit 323 generates a pulse signal corresponding to an interval in which a level of the generated intermediate calculation signal is larger than the reference value. Thus, when the level of the generated intermediate calculation signal is larger than the reference value, a phase of the pulse signal corresponds to high, such as 1, and otherwise when the level of the generated intermediate calculation signal is smaller than the reference value, a phase of the pulse signal may corresponds to low, such as 0.

When the level of the generated intermediate calculation signal is larger than the reference value, the calculation control unit 323 determines the corresponding interval as the phase of the sampled input signal Vsh.

The reference signal generating unit 330 generates the reference signal Vref, where Vref has a specific value in response to the measured phase determined by the calculation control unit 323.

Referring to FIG. 4, the reference signal generating unit 330 includes a current source I generating a current having a specific value, a capacitor C2 charging a current being provided from the current source I and a switch coupling the current source I and the capacitor C2 during a time in response to the pulse signal being received by the reference signal generating unit 330.

When the phase of the pulse signal corresponds to high, such as 1, the switch is turned on and the capacitor C2 charges, using the current of the current source I, during a turned on time to generate a specific reference voltage.

In this example, a pulse signal period does not exceed a reference clock period. This condition holds because the pulse signal occurs within a single period of the reference clock signal CLK, that is, within an interval used for integrating the maximum input signal Vpeak.

The reference signal generating unit 330 samples and holds the generated reference voltage based on the reference clock signal CLK to output the reference signal Vref. The reference signal generating unit 330 optionally separately includes a reference signal holding unit for sampling and holding the generated reference voltage.

Figure 5:
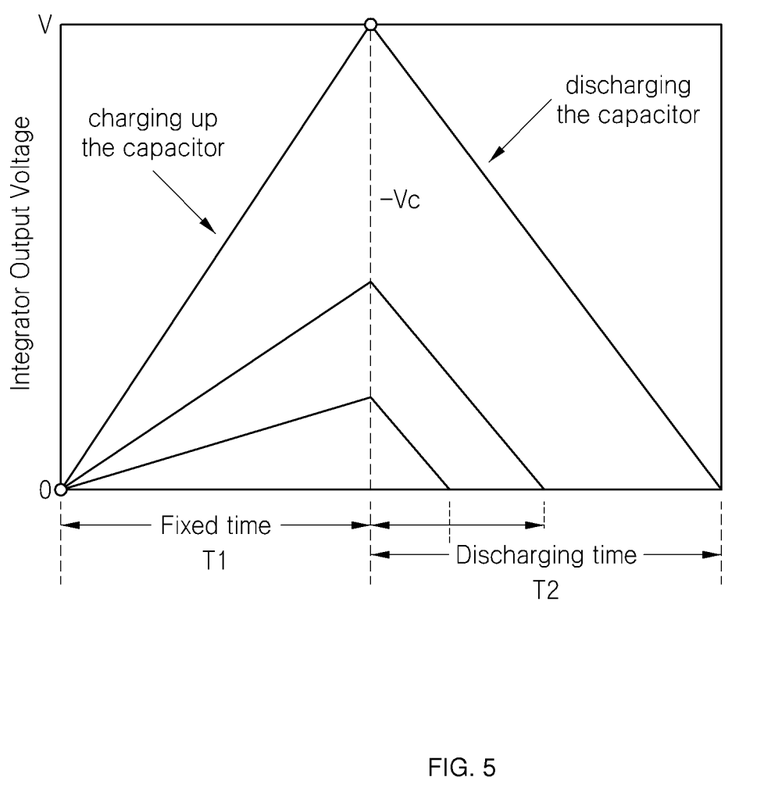

FIG. 5 is a waveform diagram illustrating a calculation of the calculation unit of FIG. 3.

Referring to FIG. 5, an X-axis indicates a time and a Y-axis indicates a level of an integrated signal. The calculation unit 322 calculates the positive integral on the sampled input signal (Vsh) during a fixed time. In an example, the fixed time is a half period of the reference clock. For example, the fixed time is T1. A slope of a signal being charged to the capacitor, such as a first interval of the immediate calculation signal, may vary according to a level of the sampled input signal Vsh. The calculation unit 322 performs the negative integral on the maximum input signal Vpeak during a next half period, for example, another half period of the reference clock. While a value of the maximum input signal Vpeak is the same, a slope of a signal being discharged to the capacitor is constant.

FIG. 5 illustrates a case where the intermediate calculation signal is greater than 0. In FIG. 5, a time where a value of the intermediate calculation signal corresponds to 0 varies based on a phase for the sampled input signal Vsh. The negative integral may be performed based on the maximum input signal Vpeak so that a time where the intermediate calculation signal is more than 0, for example, a discharging time, represented as T2, is potentially varied according to a value of the intermediate calculation signal before performing a negative integration calculation.

In more detail, a time T2 corresponding to the phase of the sampled input signal Vsh is determined by the following Equation 1.

$$V_C = -\frac{1}{C1} * \int_0^{T1} \frac{V_{in}}{R} dt = \frac{V_{in} * T1}{R * C1}, 0 < t < T1 \quad \text{Equation 1}$$

$$V_C = \frac{V_{in} * T1}{R * C1} - \frac{1}{C1} * \int_0^{T2} \frac{V_{peak}}{R} dt = \frac{V_{in} * T1 - V_{peak} * T2}{R * C1},$$

$$T1 < t < T1 + T2$$

$$T2 = \frac{V_{in} * T1}{V_{peak}}$$

In Equation 1, Vc indicates a voltage that charges the capacitor. In a second interval, from T1 to T2, of the intermediate calculation signal, Vc corresponds to 0 so that T2 indicates a relation with the input voltage Vin, the reference clock signal RCLK and the maximum input signal Vpeak.

Figure 6:
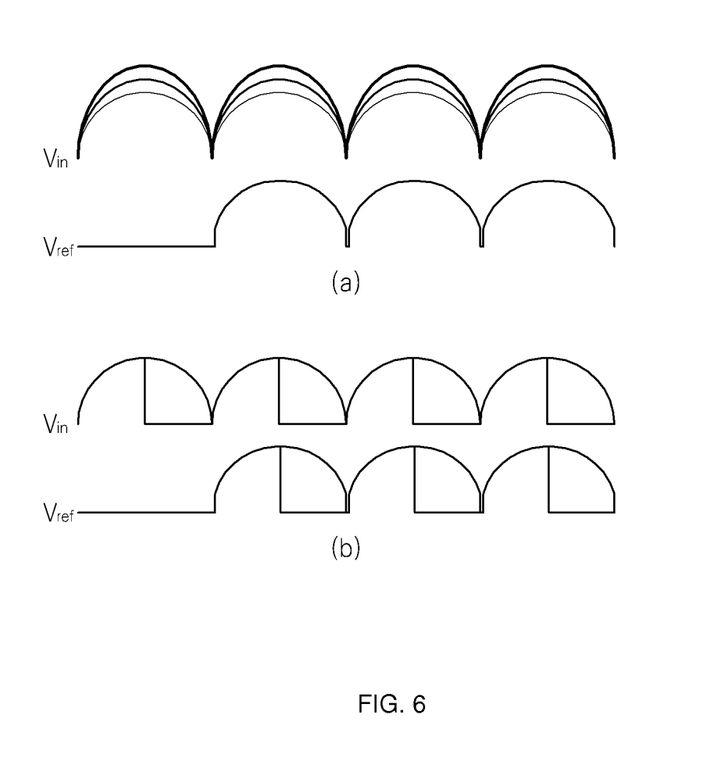
FIG. 6 is a waveform diagram illustrating a reference signal being generated by the reference signal generating circuit of FIG. 2.

FIG. 6 is a waveform diagram illustrating a reference signal being generated by the reference signal generating circuit of FIG. 2.

In FIG. 6 at (a), although a maximum level of the input signal Vin varies among three sine waves, the reference signal generating circuit 250 generates a constant level of the reference signal Vref.

Thus, the reference signal generating circuit 250 generates a reference signal where a phase and a frequency equal to those of the input signal and the maximum level have a specific value.

The reference signal generating circuit 250 detects the maximum input signal Vpeak and the frequency during a single period to generate a reference signal Vref in a next period.

In FIG. 6 at (b), when the input signal corresponds not to a sine wave but a periodic signal, the reference signal generating circuit 250 generates a reference signal where a phase and a frequency are equal to those of the input signal.

Figure 7:
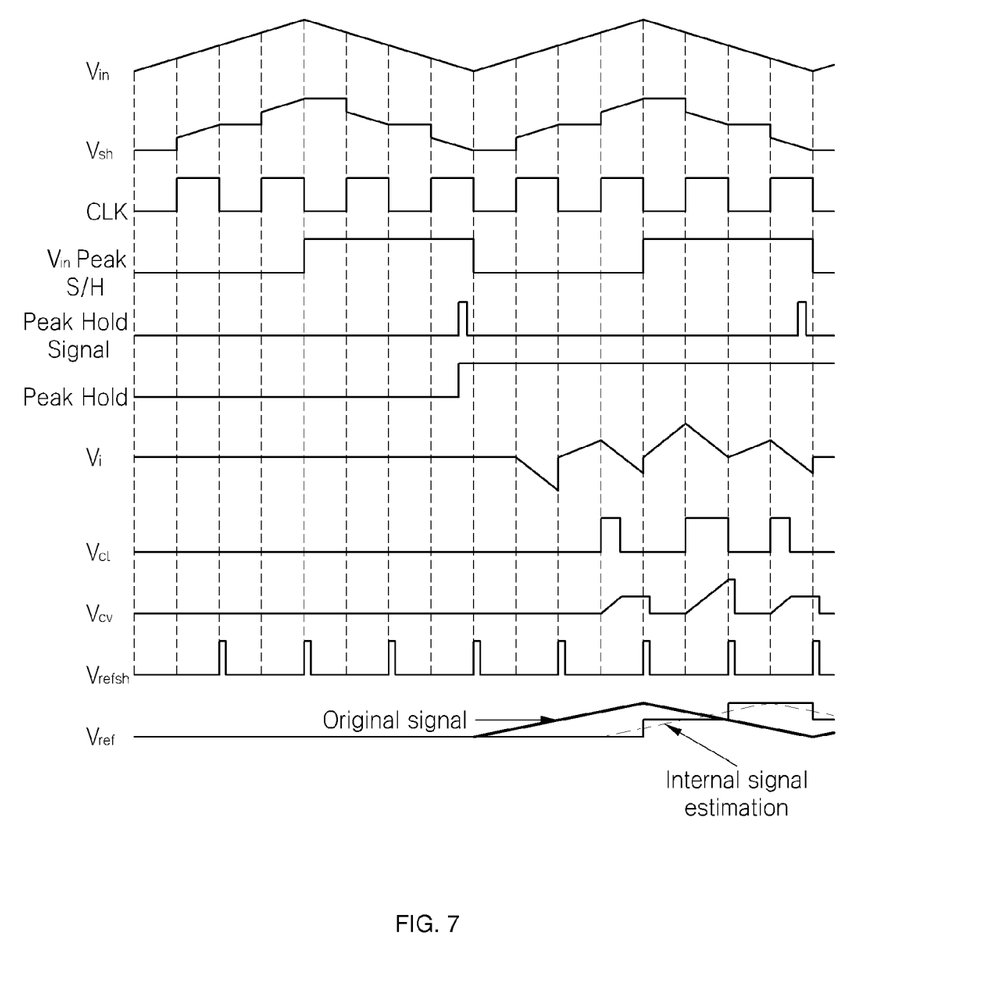
FIG. 7 is a timing diagram illustrating signals that are generated by the reference signal generating circuit of FIG. 3.

FIG. 7 is a timing diagram illustrating signals that are generated by the reference signal generating circuit of FIG. 3.

Referring to FIG. 7, the X-axis indicates a time and the Y-axis indicates variations of signal levels for signals being generated by the reference signal generating circuit 250.

A case in which it is assumed that the input signal Vin corresponds to a triangular wave form and the reference clock signal CLK corresponds to one-fourth of a period of the input signal Vin is described further, below.

In order to prevent distortion caused by the reference signal Vref from the input signal, the period of the reference clock CLK may be shorter than one-hundredth of the period of the input signal Vin.

The sampled input signal Vsh corresponds to a signal in which the detector 310 samples the input signal Vin based on the reference clock signal CLK by using the reference signal generating circuit 250.

As the above describes, when the reference clock signal CLK corresponds to the high phase, the reference signal generating circuit 250 samples the input signal Vin and when the reference clock signal CLK corresponds to the low phase, the reference signal generating circuit 250 holds the sampled input signal Vsh.

Therefore, when the reference clock signal CLK corresponds to the high phase, the input signal (Vin) is equal to the reference clock signal CLK and when the reference clock signal CLK corresponds to the low phase, a waveform of the sampled input signal Vsh is fixed on a value derived from the last interval.

The intermediate calculation signal Vi, that is, V-integral, corresponds to a signal that alternately calculates the sampled input signal Vsh in the phase measuring unit 320 and the detected maximum input signal Vpeak to be generated.

The reference signal generating circuit 250 measures the phases of the sampled input signal Vsh based on the sampled input signal Vsh and the maximum input signal Vpeak to hold a calculation related with measuring a phase before detecting the maximum input signal Vpeak. Therefore, the intermediate calculation signal Vi is potentially a constant value during a first period.

In one example, the reference signal generating circuit 250 generates another control signal, such as a peak hold signal, indicating whether the maximum input signal Vpeak is detected. In such an example, the reference signal generating circuit 250 operates the phase measuring unit 320 and the reference signal generating unit 330 based on the control signal.

The reference signal generating circuit 250 performs an integration calculation on the sampled input signal Vsh after the first period. When the reference clock signal CLK corresponds to a high phase, the reference signal generating circuit 250 performs a negative integral on the maximum input signal Vpeak. When the reference clock signal CLK corresponds to a low phase, the reference signal generating circuit 250 performs a positive integral on the sampled input signal Vsh.

When the reference clock signal CLK changes from the high phase to the low phase, the reference signal generating circuit 250 potentially performs initialization, that is, a resetting to 0V, on a value of the intermediate calculation signal Vi.

The reference signal generating circuit 250 repeatedly performs an integration calculation based on the reference clock signal CLK to vary the intermediate calculation signal Vi to fluctuate up and down from an initial value, such as 0. Herein, when the positive integration calculation is performed, a slope of the intermediate calculation signal Vi is varied according to the sampled input signal Vin and when the negative integration calculation is performed, the maximum input signal Vpeak is constant.

The pulse signal Vct corresponds to a signal that converts the intermediate signal Vi into the time domain to be generated in the reference signal generating circuit 250. Thus, the reference signal generating circuit 250 generates the pulse signal Vct that corresponds to an interval where a level of the intermediate calculation signal Vi is more than a reference level, such as an interval where Vi has a value more than 0, based on the reference clock signal CLK.

For example, the pulse signal Vct indicate a waveform having the high phase while the reference clock signal CLK corresponds to the high phase and the value of the intermediate calculation signal Vi is more than 0. In this case, the reference signal generating circuit 250 measures a phase of the sampled input signal Vsh.

In the reference signal generating circuit 250, the reference voltage Vcv corresponds to a signal that converts the pulse signal Vct into a voltage to be generated and that corresponds to a voltage being preprocessed in order to generate the reference signal Vref.

The procedure generating the reference voltage Vcv is illustrated above with reference to FIG. 4.

The control signal Vrefsh controls sampling and holding for the reference voltage Vcv. The control signal Vrefsh potentially has a period equal to that of the reference clock signal CLK and is indicative of an impulse signal at a time that varies with the reference clock CLK signal. Thus, the control signal Vrefsh corresponds to a time of variance from the high phase to low phase.

The reference signal generating circuit 250 samples and holds the reference voltage Vcv, based on the reference signal generating circuit 250 to ultimately generate the reference signal Vref.

In FIG. 7, as described above, the reference signal Vref indicates a stepped waveform where a period of the stepped waveform is slower than that of the input signal Vin by one-fourth of a period. When the period of the reference clock signal CLK is shorter than one-hundredth of a period of the input signal Vin, the reference signal Vref assumes values that are substantially equal to the input signal Vin.

Figure 8:
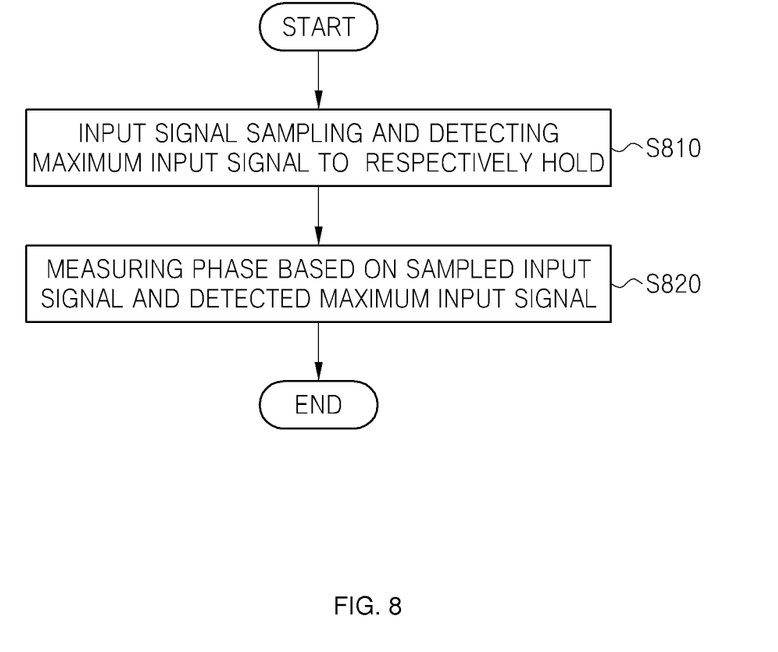
FIG. 8 is a flowchart illustrating an example of a reference signal generating method being performed by the reference signal generating circuit of FIG. 2.

FIG. 8 is a flowchart illustrating one example of a reference signal generating method that is performed by the reference signal generating circuit of FIG. 2.

Referring to FIG. 8, the method samples the input signal Vin according to the reference clock CLK to detect and to respectively hold the maximum input signal Vpeak in operation S810. For example, the reference signal generating circuit 250 samples the input signal Vin according to the reference clock CLK to detect and to respectively hold the maximum input signal Vpeak.

In operation S820, the method measures the phase of the sampled input signal Vsh based on the detected input signal and the detected maximum input signal. For example, the reference signal generating circuit 250 measures the phase of the sampled input signal Vsh based on the detected input signal and the detected maximum input signal Vpeak.

In one example, the reference signal generating circuit 250 measures the phase of the sampled input signal Vsh by performing the division calculation as discussed above.

Figure 9:
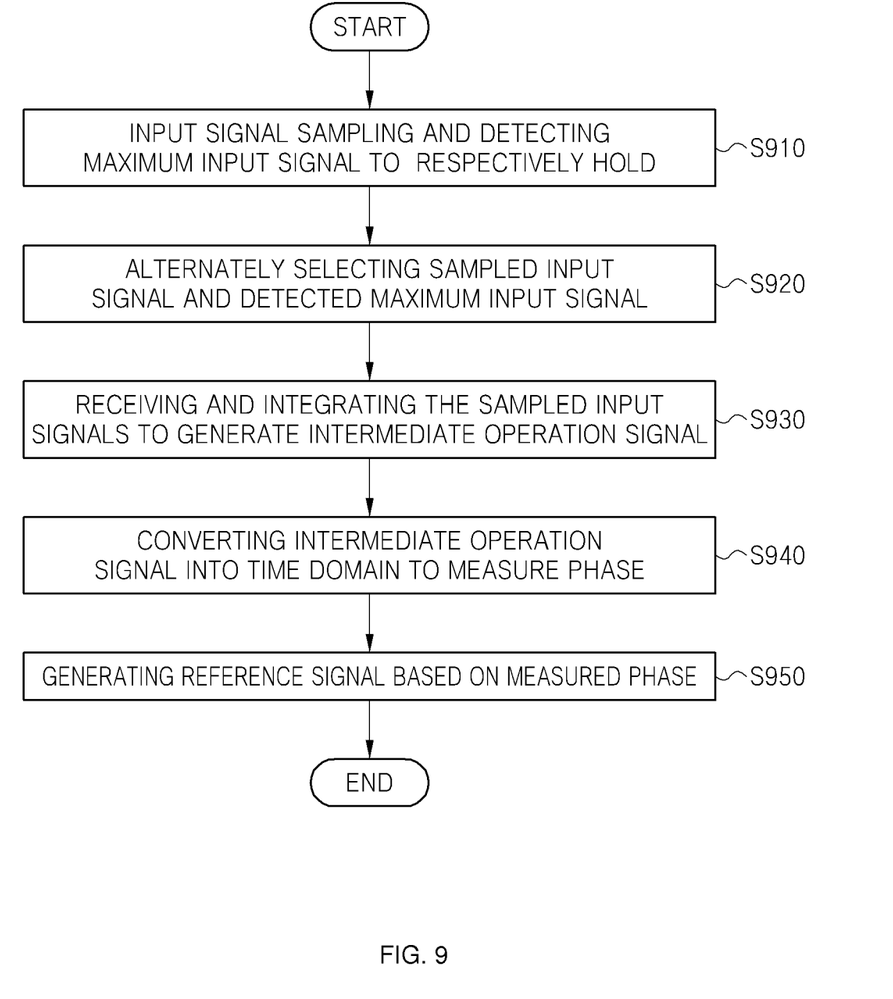
FIG. 9 is a flowchart illustrating another example of a reference signal generating method being performed by the reference signal generating circuit of FIG. 2.

FIG. 9 is a flowchart illustrating another example of a reference signal generating method that is performed by the reference signal generating circuit of FIG. 2.

Referring to FIG. 9, at operation S910, the method samples the input signal Vin according to the reference clock signal CLK to detect and to respectively hold the maximum input signal. For example, the reference signal generating circuit 250 samples the input signal Vin according to the reference clock signal CLK to detect and to respectively hold the maximum input signal Vpeak.

At operation S920, the method alternately selects the sampled input signal Vsh and the detected maximum input signal Vpeak based on the reference clock signal CLK. For example, the reference signal generating circuit 250 alternately selects the sampled input signal Vsh and the detected maximum input signal Vpeak based on the reference clock signal CLK.

At operation S930, the method receives and integrates the selected signals Vsh and Vpeak according to the reference clock CLK to generate the intermediate calculation signal Vi. For example, the reference signal generating circuit 250 receives and integrates the selected signals Vsh and Vpeak according to the reference clock CLK to generate the intermediate calculation signal Vi.

In one example, the reference signal generating circuit 250 performs the positive integration on the sampled input signal Vsh and performs the negative integration on the detected maximum input signal Vpeak.

At operation S940, the method converts the intermediate calculation signal Vi into the time domain to measure the phase of the sampled input signal. For example, the reference signal generating circuit 250 converts the intermediate calculation signal Vi into the time domain to measure the phase of the sampled input signal Vsh.

In one example, during performing integration calculation on the detected maximum input signal Vpeak, the reference signal generating circuit 250 generates a pulse signal corresponding to an interval where a level of the intermediate calculation signal Vi is greater than the reference level, such as 0V.

At operation S950, the method generates the reference signal Vref in response to the measured phase. For example, The reference signal generating circuit 250 generates the reference signal Vref in response to the measured phase.

In one example, the reference signal generating circuit 250 generates the reference signal Vref as having a specific level in response to the measured phase.

In one example, the reference signal generating circuit 250 charges a current with a specific value during a time that corresponds to the measured phase to generate the reference voltage. In this example, the reference signal generating circuit 250 samples and holds the generated reference voltage based on the reference clock signal CLK to output the reference signal Vref.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blu-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

A computing system or a computer may include a microprocessor that is electrically connected to a bus, a user interface, and a memory controller, and may further include a flash memory device. The flash memory device may store N-bit data via the memory controller. The N-bit data may be data that has been processed and/or is to be processed by the microprocessor, and N may be an integer equal to or greater than 1. If the computing system or computer is a mobile device, a battery may be provided to supply power to operate the computing system or computer. It will be apparent to one of ordinary skill in the art that the computing system or computer may further include an application chipset, a camera image processor, a mobile Dynamic Random Access Memory (DRAM), and any other device known to one of ordinary skill in the art to be included in a computing system or computer. The memory controller and the flash memory device may constitute a solid-state drive or disk (SSD) that uses a non-volatile memory to store data.

TABLE 1

Description of Symbols

| Item Number | Description |
| --- | --- |
| 200 | POWER FACTOR COMPENSATION CIRCUIT |
| 210 | RECTIFICATION UNIT |
| 220 | POWER TRANSFER DEVICE |
| 230 | OUTPUT SWITCH |
| 240 | OUTPUT CAPACITOR |
| 250 | REFERENCE SIGNAL GENERATING CIRCUIT |
| 260 | OUTPUT VOLTAGE DETECTION UNIT |
| 270 | POWER FACTOR COMPENSATION CONTROL UNIT |
| 280 | DIODE |
| 310 | DETECTOR |
| 311 | SAMPLING UNIT |
| 312 | PEAK DETECTOR |
| 320 | PHASE MEASURING UNIT |
| 321 | SELECTION SWITCH UNIT |
| 322 | CALCULATION UNIT |
| 323 | CALCULATION CONTROL UNIT |
| 330 | REFERENCE SIGNAL GENERATING UNIT |

Applicants present Table 1, above. Table 1 explains how the numerical labels of elements of examples presented in the Figures are to be interpreted.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A reference signal generating circuit for generating a reference signal based on an input signal for power factor compensation of a power converter, the reference signal generating circuit comprising:

a detector configured to sample the input signal according to a reference clock signal and to detect a maximum input signal to hold;

a phase measuring unit configured to measure a phase of the sampled input signal based on the sampled input signal and the detected maximum input signal; and a reference signal generating unit configured to generate a reference signal having a specific value in response to the measured phase, wherein the reference signal generating unit is configured to sample and to hold the generated reference voltage based on the reference clock signal to output the reference signal.

2. The reference signal generating circuit of claim 1, wherein the detector comprises:
 a sampling unit configured to repeatedly sample the input signal and hold the sampled input signal based on the reference clock signal; and
 a peak detector configured to detect and hold the maximum input signal.

3. The reference signal generating circuit of claim 1, wherein the phase measuring unit comprises a selection switch configured to alternately couple the sampling unit and an output terminal of the detector to an input terminal of the phase measuring unit based on the reference clock signal.

4. The reference signal generating circuit of claim 1, wherein the phase measuring unit comprises:
 a calculation unit configured to alternately receive and integrate the sampled input signal according to the reference clock signal and the detected maximum input signal to generate an intermediate calculation signal; and
 a calculation control unit configured to convert the intermediate calculation signal into a time domain to measure the phase of the sampled input signal.

5. The reference signal generating circuit of claim 4, wherein the calculation unit performs a positive integration calculation on the sampled input signal and performs a negative integration calculation on the detected maximum input signal.

6. The reference signal generating circuit of claim 4, wherein the calculation control unit generates a pulse signal based on an interval where a level of the intermediate calculation signal is larger than a reference value while the calculation unit performs the integral calculation on the detected maximum input signal.

7. The reference signal generating circuit of claim 1, wherein the phase measuring unit comprises a division calculation unit configured to measure a phase of the sampled input signal by performing a division calculation.

8. The reference signal generating circuit of claim 1, wherein the reference signal generating unit comprises:
 a current source configured to provide a current having a specific value;
 a capacitor configured to charge using the current having the specific value to generate a reference voltage; and
 a switch configured to serially couple the current source and the capacitor based on the measured phase.

9. A power factor compensation apparatus for compensating a power factor of a power converter, the power factor compensation apparatus comprising:
 a power transfer device into which an input current corresponding to an input signal flows;
 an output switch that is coupled to the power transfer device, the output switch being configured to adjust an output voltage that is generated by the input current of the power transfer device;
 an output capacitor configured to charge using the input current to generate a output voltage;
 a reference signal generating circuit configured to generate a reference signal based on the input signal; and
 a power factor compensation control unit configured to compare the output voltage and the reference signal to control the output switch,
wherein the reference signal generating circuit comprises
 a detector configured to sample the input signal according to a reference clock signal and to detect a maximum input signal to hold,
 a phase measuring unit configured to measure a phase of the sampled input signal based on the sampled input signal and the detected maximum input signal, and
 a reference signal generating unit configured to generate a reference signal having a specific value in response to the measured phase, wherein the phase measuring unit comprises
 a calculation unit configured to alternately receive and integrate the sampled input signal according to the reference clock signal and the detected maximum input signal to generate an intermediate calculation signal.

10. A reference signal generating method for generating a reference signal corresponding to an input signal for a power factor compensation of a power converter, the reference signal generating method comprising:
 sampling the input signal based on a reference clock and detecting a maximum input signal to hold;
 measuring a phase of the sampled input signal based on the sampled input signal and the detected maximum input signal; and
 generating a reference signal having a specific value in response to the measured phase, wherein the measuring comprises
 alternately receiving and integrating the sampled input signal according to the reference clock signal and the detected maximum input signal to generate an intermediate calculation signal.

11. The reference signal generating method of claim 10, wherein the measuring comprises alternately selecting the sampled input signal based on the reference clock signal and the detected maximum input signal.

12. The reference signal generating method of claim 11, wherein the measuring further comprises:
 converting the intermediate calculation signal into a time domain to measure the phase of the sampled input signal.

13. The reference signal generating method of claim 12, wherein the converting generates a pulse signal based on an interval where a level of the intermediate calculation signal is larger than a reference value while the integration calculation for the detected maximum input signal is performed.

14. The reference signal generating method of claim 10, wherein the alternatively receiving and integrating comprises performing a positive integration calculation on the sampled input signal and performing a negative integration calculation on the detected maximum input signal.

15. The reference signal generating method of claim 10, wherein the generating the reference signal charges a capacitor using a current having a specific value based on the measured phase to generate a reference voltage.

16. The reference signal generating method of claim 15, wherein the generating the reference signal further comprises sampling and holding the generated reference voltage based on the reference clock signal to output the reference signal.

17. The reference signal generating method of claim 10, wherein the measuring measures a phase of the sampled input signal by performing a division calculation.

18. The apparatus of claim 9, wherein the phase measuring unit further comprises a calculation control unit configured to convert the intermediate calculation signal into a time domain to measure the phase of the sampled input signal.

19. A circuit for measuring phase information, the circuit comprising:
   a detector configured to sample the input signal according to a reference clock signal and to detect a maximum input signal to hold; and
   a phase measuring unit configured to measure a phase of the sampled input signal based on the sampled input signal and the detected maximum input signal,
   wherein the phase measuring unit comprises
   a calculation unit configured to alternately receive and integrate the sampled input signal according to the reference clock signal and the detected maximum input signal to generate an intermediate calculation signal.

20. The circuit of claim 19, wherein the detector comprises:
   a sampling unit configured to repeatedly sample the input signal and hold the sampled input signal based on the reference clock signal; and
   a peak detector configured to detect and hold the maximum input signal.

21. The circuit of claim 19, wherein the phase measuring unit further comprises:
   a calculation control unit configured to convert the intermediate calculation signal into a time domain to measure the phase of the sampled input signal.

22. A power factor compensation apparatus for compensating a power factor of a power converter, the power factor compensation apparatus comprising:
   a power transfer device into which an input current corresponding to an input signal flows;
   an output switch that is coupled to the power transfer device, the output switch being configured to adjust an output voltage that is generated by the input current of the power transfer device;
   an output capacitor configured to charge using the input current to generate a output voltage;
   a reference signal generating circuit configured to generate a reference signal based on the input signal; and
   a power factor compensation control unit configured to compare the output voltage and the reference signal to control the output switch,
   wherein the reference signal generating circuit comprises
   a detector configured to sample the input signal according to a reference clock signal and to detect a maximum input signal to hold,
   a phase measuring unit configured to measure a phase of the sampled input signal based on the sampled input signal and the detected maximum input signal, and
   a reference signal generating unit configured to generate a reference signal having a specific value in response to the measured phase by sampling and holding the generated reference voltage based on the reference clock signal.

23. A reference signal generating method for generating a reference signal corresponding to an input signal for a power factor compensation of a power converter, the reference signal generating method comprising:
   sampling the input signal based on a reference clock and detecting a maximum input signal to hold;
   measuring a phase of the sampled input signal based on the sampled input signal and the detected maximum input signal; and
   generating a reference signal having a specific value in response to the measured phase by sampling and holding the generated reference voltage based on the reference clock signal.

* * * * *